United States Patent
Koo

(10) Patent No.: US 8,638,627 B2
(45) Date of Patent: Jan. 28, 2014

(54) SEMICONDUCTOR MEMORY DEVICE FOR MINIMIZING MISMATCH OF SENSE AMPLIFIER

(75) Inventor: Dong Chul Koo, Seongnam-si (KR)

(73) Assignee: Hynix Semiconductor Inc., Icheon (KR)

( * ) Notice: Subject to any disclaimer, the term of this patent is extended or adjusted under 35 U.S.C. 154(b) by 81 days.

(21) Appl. No.: 13/347,450

(22) Filed: Jan. 10, 2012

(65) Prior Publication Data

US 2012/0213025 A1    Aug. 23, 2012

(30) Foreign Application Priority Data

Feb. 20, 2011   (KR) .................. 10-2011-0015620

(51) Int. Cl.
   *G11C 7/06*   (2006.01)
(52) U.S. Cl.
   USPC .......................... 365/205; 365/207
(58) Field of Classification Search
   USPC ........................................................ 365/206
   See application file for complete search history.

(56) References Cited

U.S. PATENT DOCUMENTS

| | | | |
|---|---|---|---|
| 5,241,504 A * | 8/1993 | Seevinck | 365/205 |
| 5,894,233 A | 4/1999 | Yoon | |
| 5,982,689 A * | 11/1999 | Takahashi | 365/205 |
| 5,999,470 A * | 12/1999 | Takahashi | 365/207 |
| 6,414,521 B1 | 7/2002 | Potter | |
| 6,608,789 B2 * | 8/2003 | Sullivan et al. | 365/205 |
| 6,754,121 B2 * | 6/2004 | Worley | 365/207 |
| 7,227,798 B2 * | 6/2007 | Gupta et al. | 365/205 |
| 8,027,214 B2 * | 9/2011 | Lin et al. | 365/207 |
| 2012/0213010 A1 * | 8/2012 | Wu et al. | 365/189.05 |

FOREIGN PATENT DOCUMENTS

| KR | 10-0200079 B1 | 6/1999 |
|---|---|---|
| KR | 10-2009-0119304 A | 11/2009 |

* cited by examiner

*Primary Examiner* — Tan T. Nguyen

(57) ABSTRACT

A semiconductor memory device is provided. The semiconductor memory device includes a cross-coupled latch type sense amplifier and a buffer that prevents mismatch. The buffer is formed between PMOS transistors and NMOS transistors of the sense amplifier so that mismatch for transistors operating in pair can be minimized.

18 Claims, 4 Drawing Sheets

SEMICONDUCTOR MEMORY DEVICE FOR MINIMIZING MISMATCH OF SENSE AMPLIFIER

CROSS-REFERENCES TO RELATED APPLICATION

The present application claims priority to Korean patent application number 10-2011-0015620, filed on 22 Feb. 2011, which is incorporated by reference in its entirety.

BACKGROUND OF THE INVENTION

1. Technical Field

The inventive concept relates to a semiconductor memory device, and more particularly, to a semiconductor memory device capable of minimizing mismatch of transistors which operate in pairs in a sense amplifier.

2. Related Art

Semiconductor memory devices generally include bit line sense amplifiers which sense and amplify data stored in memory cells.

A method of sensing by a general sense amplifier is by differential pair sensing. The most commonly used sense amplifier is a cross-coupled latch type sense amplifier.

However, invalid sensing, or sensing of invalid data, may occur in cross-coupled latch type sense amplifier when there is mismatch of a threshold voltage between components (for example, transistors) of the sense amplifier.

FIG. 1 is a circuit diagram illustrating a configuration of a general cross-coupled latch type sense amplifier unit corresponding to a folded type bit line structure.

The sense amplifier unit 1 operates by power supply signals SAP and SAN. The sense amplifier unit 1 includes a sense amplifier 2, a precharge unit 4, an equalization unit 6, and a data output unit 8. The sense amplifier 2 senses and amplifies a difference between signals of a bit line pair BL and /BL. The precharge unit 4 is enabled by a precharge signal BLEQ when the sense amplifier 2 does not operate, and precharges the bit line pair BL and /BL to a bit line precharge voltage VBLP. The equalization unit 6 is enabled by the precharge signal BLEQ, and causes voltage levels of the bit line pair BL and /BL to be equalized. The data output unit 8 outputs a data signal amplified by the sense amplifier 2 through local data lines LDB and LDBB according to a column control signal Y1. FIG. 1 illustrates one example of the circuit configuration of the sense amplifier unit 1. In other implementations, a substantial configuration of the sense amplifier 1 may be varied according to a manufacturer or a specification of a memory device.

Among the configuration of the sense amplifier unit 1, the sense amplifier 2, the precharge unit 4, and the data output unit 8 operate by forming two transistors in pairs. Thus, when mismatch occurs between transistors that form one or more of the pairs, the semiconductor device does not normally operate.

FIG. 2 is a view illustrating a substantial layout of the sense amplifier unit 1 formed in a second-generation double data rate type three (2G DDR3) memory device having a $6F^2$ structure.

Referring to FIG. 2, transistors EQ TR of the equalization unit 6 are formed in a center portion of the sense amplifier unit 1. NMOS transistors Latch Tr-NMOS and PMOS transistors Latch Tr-PMOS constituting the sense amplifier 2 are formed at both sides of the equalization unit 6.

The NMOS transistors Latch Tr-NMOS and the PMOS transistors Latch Tr PMOS are formed so that two transistors form each pair and the transistor pairs are disposed in parallel.

That is, in each sense amplifier 2, two NMOS transistors SAN(L) and SAN(R), in which drains thereof are commonly connected, and two PMOS transistors SAP(L) and SAP(R), in which drains thereof are commonly connected, form pairs and are disposed in parallel at both sides of the transistors EQ Tr of the equalization unit 6.

When the sense amplifier is manufactured, impurities are implanted into active regions of NMOS transistors in a state that PMOS transistor regions are covered by a photoresist PR with NMOS transistor regions being open.

In the NMOS transistors Top SAN(R) and Top SAN(L) and the NMOS transistors Bottom SAN(R) and Bottom SAN(L) that are arranged in parallel, distances of the active regions of the NMOS transistors Top SAN(R) and Top SAN(L) spaced from a sidewall PRW of the photoresist PR, which covers the PMOS transistor regions, are different. Distances of the active regions of the NMOS transistors Bottom SAN(R) and Bottom SAN(L) spaced from the sidewall PRW of the photoresist PR are different. Thus, a mismatch may result when concentrations of impurities implanted into the active regions are different in an impurity implantation process. That is, since the distances between the NMOS transistors Top SAN(R) and Top SAN(L) and the sidewall PRW of the photoresist PR and the distances between the NMOS transistors Bottom SAN(R) and Bottom SAN(L) and the sidewall PRW of the photoresist PR are different, impurities reflected from the sidewall of the photoresist PR in the impurity implantation process are mostly implanted into the NMOS transistors Top SAN(R) and Bottom SAN(L) adjacent to the sidewall PRW of the photoresist PR. Thus, mismatch occurs between the two NMOS transistors SAN(L) and SAN(R), which operate in pair. Similarly, mismatch also occurs between the two PMOS transistors SAP(L) and SAP(R), which operate in pair.

SUMMARY

Various embodiments of the technique described herein minimize mismatch between transistors which operate in pair in a sense amplifier.

According to one aspect of an embodiment, a semiconductor memory device may include a sense amplifier and a buffer. The sense amplifier senses and amplifies a difference between signals of a bit line pair. The sense amplifier may include PMOS transistors and NMOS transistors, and may be a cross-coupled latch type sense amplifier. The buffer prevents mismatch, and may be formed between the PMOS transistors and the NMOS transistors.

The buffer may include an equalization transistor which equalizes voltage levels of the bit line pair according to a precharge signal.

The buffer may include a dummy transistor.

The buffer may be formed on one side of the NMOS transistors of the sense amplifier, with the PMOS transistors formed on an outer side of the buffer that is closer to a sidewall of a photoresist. At least one of the NMOS transistors of the sense amplifier may be spaced from the sidewall of the photoresist by 0.6 µm or more. Alternatively, the buffer may be formed on one side of the PMOS transistors, with the NMOS transistors formed on an outer side of the buffer that is closer to the sidewall of the photoresist. At least one of the PMOS transistors of the sense amplifier may be spaced from the sidewall of the photoresist by 0.6 µm or more.

The buffer may include an equalization transistor. The NMOS transistors of the sense amplifier may be formed on an inner side of the equalization transistor and the PMOS transistors of the sense amplifier may be formed on an outer side of the equalization transistor that is closer to a sidewall of a photoresist than the inner side. At least one of the NMOS transistors of the sense amplifier may be spaced from the sidewall of the photoresist by 0.6 μm or more.

The buffer may include an equalization transistor. The PMOS transistors of the sense amplifier may be formed on an inner side of the equalization transistor and the NMOS transistors of the sense amplifier may be formed on an outer side of the equalization transistor that is closer to a is sidewall of a photoresist than the inner side. At least one of the PMOS transistors of the sense amplifier may be spaced from the sidewall of the photoresist by 0.6 μm or more.

These and other features, aspects, and embodiments are described below in the section entitled "DESCRIPTION OF EXEMPLARY EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings.

DESCRIPTION OF EXEMPLARY EMBODIMENTS

Figure 1:
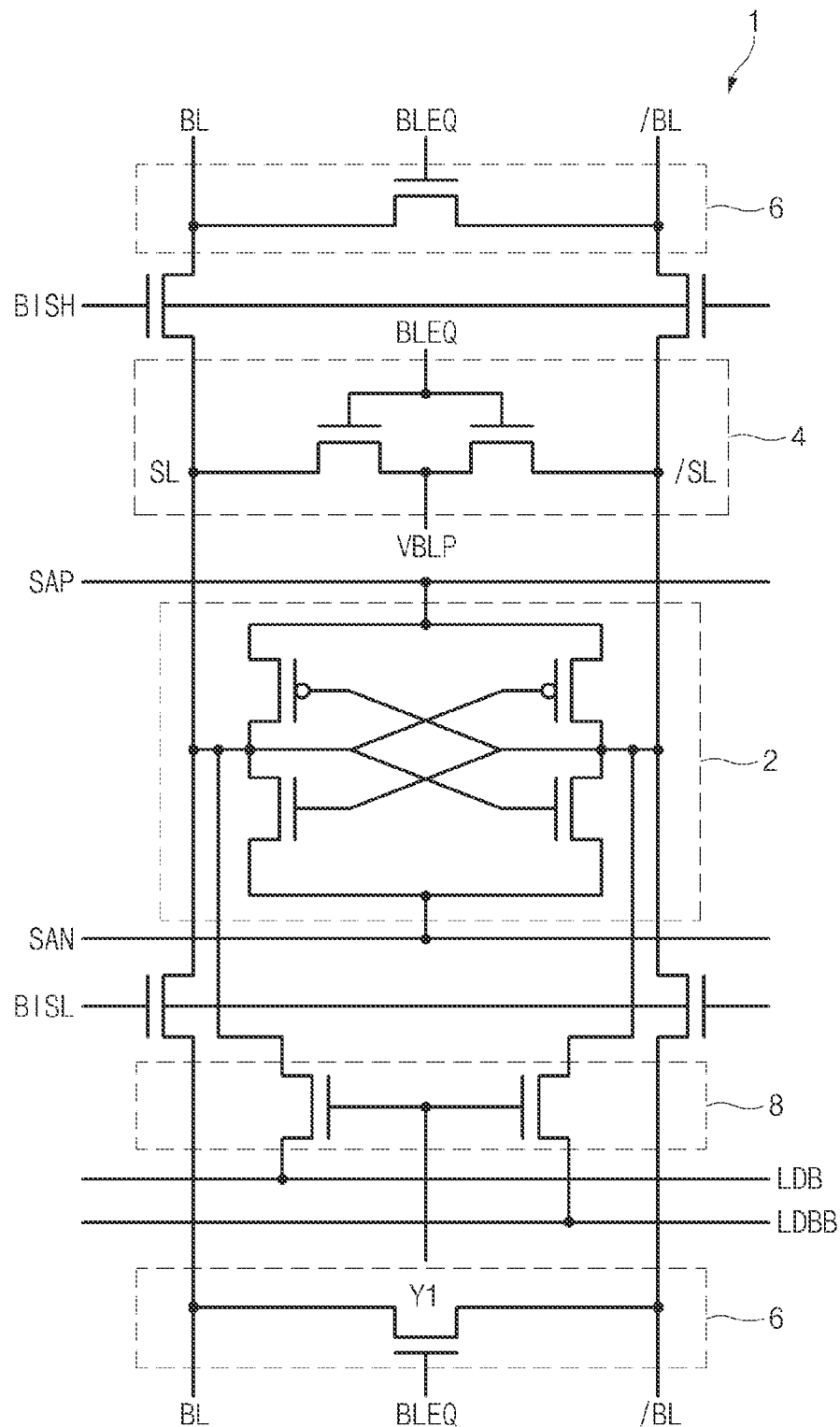
FIG. 1 is a circuit diagram illustrating a configuration of a general cross-coupled latch type sense amplifier unit corresponding to a folded type bit line structure.

Exemplary embodiments are described herein with reference to cross-sectional illustrations that are schematic illustrations of exemplary embodiments (and intermediate structures). As such, variations from the shapes of the illustrations as a result of manufacturing techniques and/or tolerances, for example, are to be expected. Thus, exemplary embodiments should not be construed as limited to the particular shapes of regions illustrated herein but may also include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, exemplary embodiments of the inventive concept will be described in further detail with reference to accompanying drawings.

Figure 3:
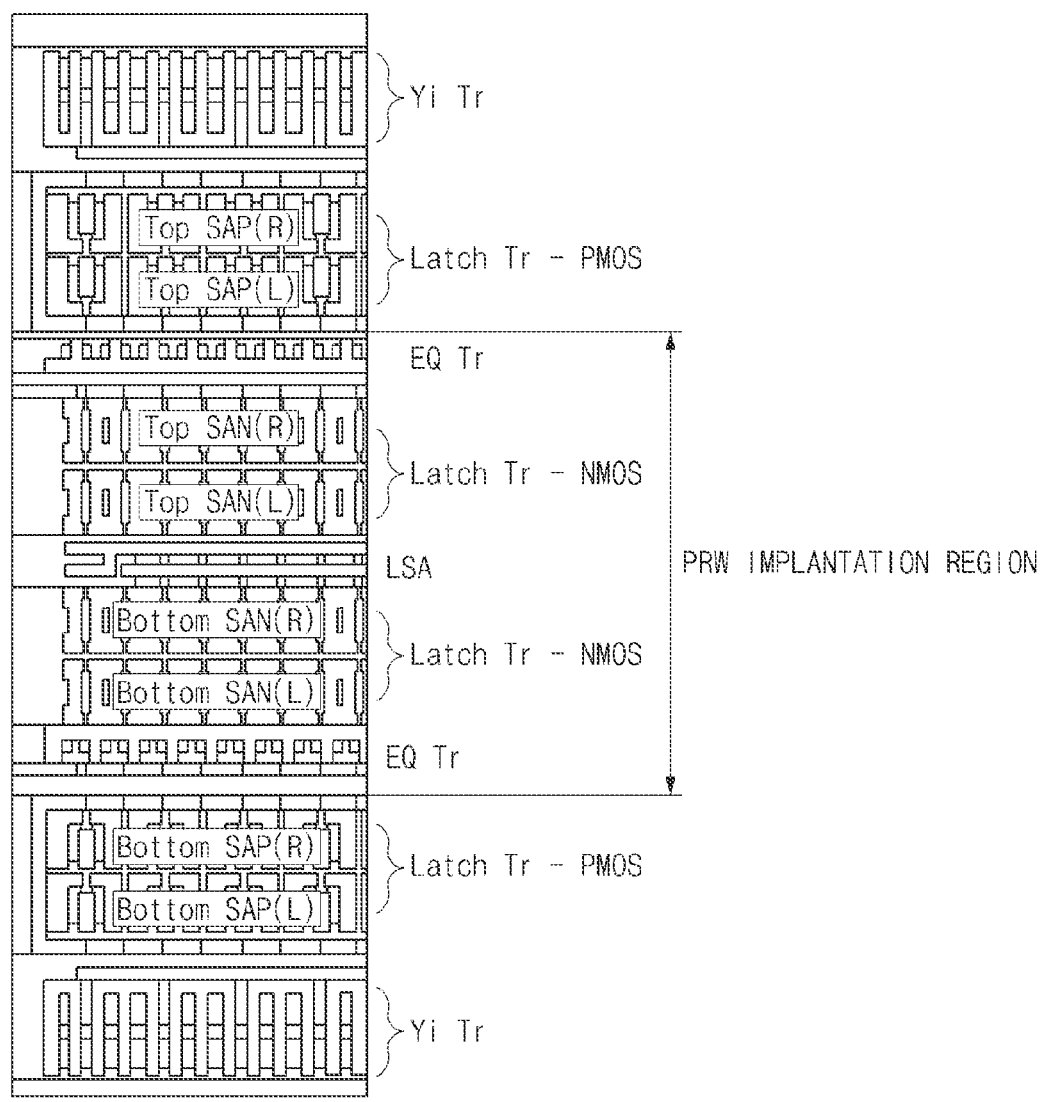
FIG. 3 is a plan view illustrating a layout of a sense amplifier according to an embodiment of the inventive concept.

FIG. 3 is a plan view illustrating a layout of a sense amplifier according an embodiment of the inventive concept.

In an embodiment, only one transistor operates to prevent mismatch without operating in pair. More specifically, a transistor of an equalization unit (hereinafter referred to as an equalization transistor), which causes voltage levels of a bit line pair BL and /BL to be equalized in the sense amplifier, is formed between NMOS transistors Latch Tr-NMOS and PMOS transistors Latch Tr-PMOS that constitute a cross-coupled latch type sense amplifier.

Figure 2:
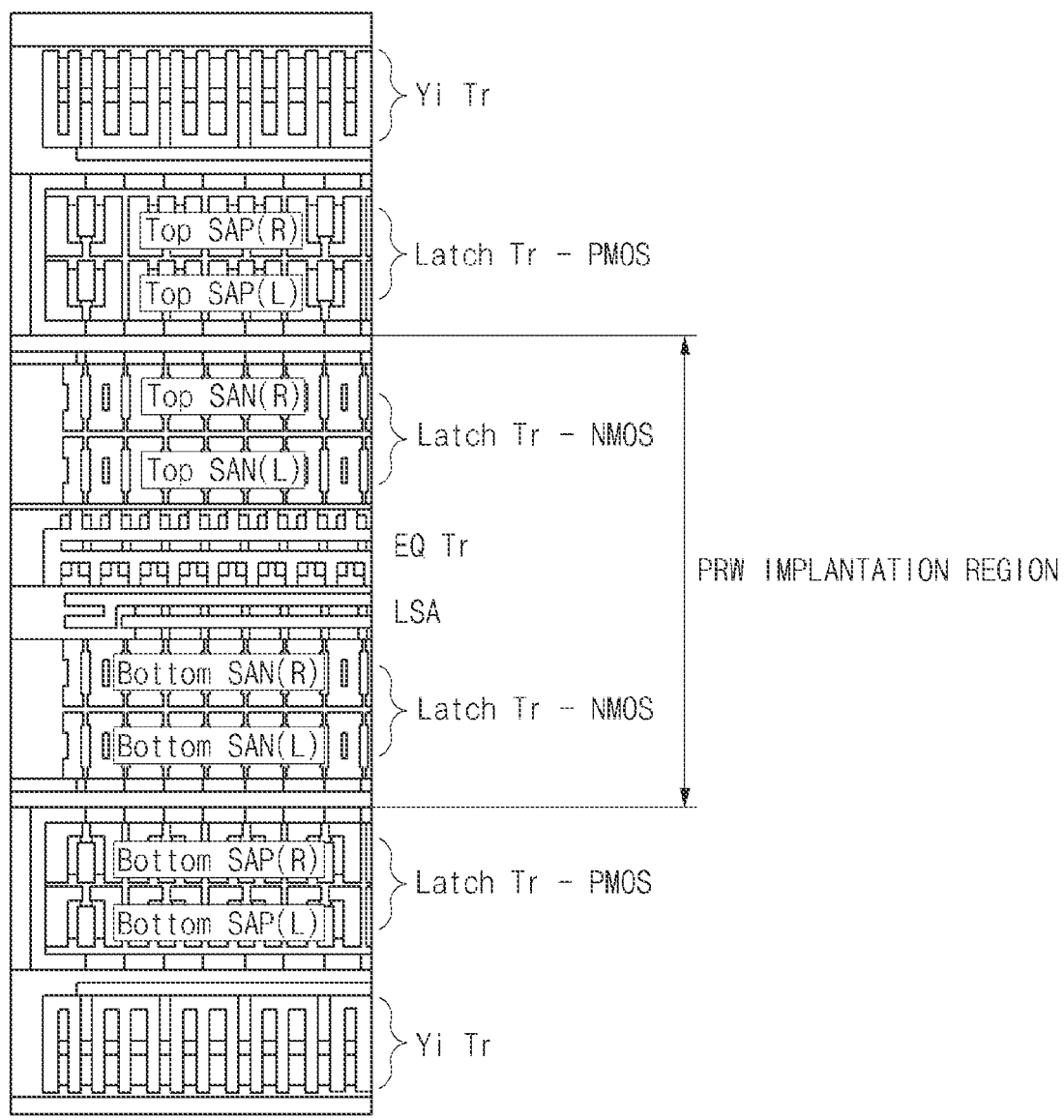
FIG. 2 is a plan view illustrating a substantial layout of a sense amplifier formed in a second generation double data rate type three (2G DDR3) memory device having a $6F^2$ structure.

As shown in FIG. 2, the equalization transistor EQ Tr is formed in a center portion of the sense amplifier (the region between the NMOS transistors Top SAN(L) and Bottom SAN (R). In contrast, in the embodiment shown in FIG. 3, equalization transistors EQ Tr independent of mismatch are separately formed between an NMOS transistor Top SAN(R) and a PMOS transistor Top SAP(L) as well as between an NMOS transistor Bottom SAN(L) and a PMOS transistor Bottom SAP(R). As a result, the equalization transistors EQ Tr are significantly spaced apart between the NMOS transistors Latch Tr-NMOS and a sidewall PRW of a photoresist PR. Given the structure as described, an effect on the NMOS transistors Latch Tr-NMOS caused by impurities collided with and reflected from the sidewall PRW of the photoresist PR in an impurity implantation process can be minimized. In an embodiment, positions of the PMOS transistors Latch Tr-PMOS may remain unchanged.

Thus, given the positions of the PMOS transistors Latch Tr-PMOS being unchanged, the NMOS transistors Latch Tr-NMOS are formed in positions closer to a center portion of the sense amplifier by a predetermined distance so that the equalization transistors EQ tr are formed between the NMOS transistors Latch Tr-NMOS and the PMOS transistors Latch Tr-PMOS. That is, the equalization transistors EQ Tr are formed between the NMOS transistors and the PMOS transistors and the region in which the equalization transistors EQ Tr are formed in FIG. 2 becomes an empty space. Therefore, as shown in FIG. 3, upper NMOS transistors Top SAN(R) and Top SAN(L) and lower NMOS transistors Bottom SAN(R) and Bottom SAN(L) are moved toward the center portion by a corresponding space. Accordingly, with the footprint of the sense amplifier remaining unchanged, the distance between the sidewall PRW of the photoresist PR and the NMOS transistors Latch Tr-NMOS may be increased.

Figure 4:
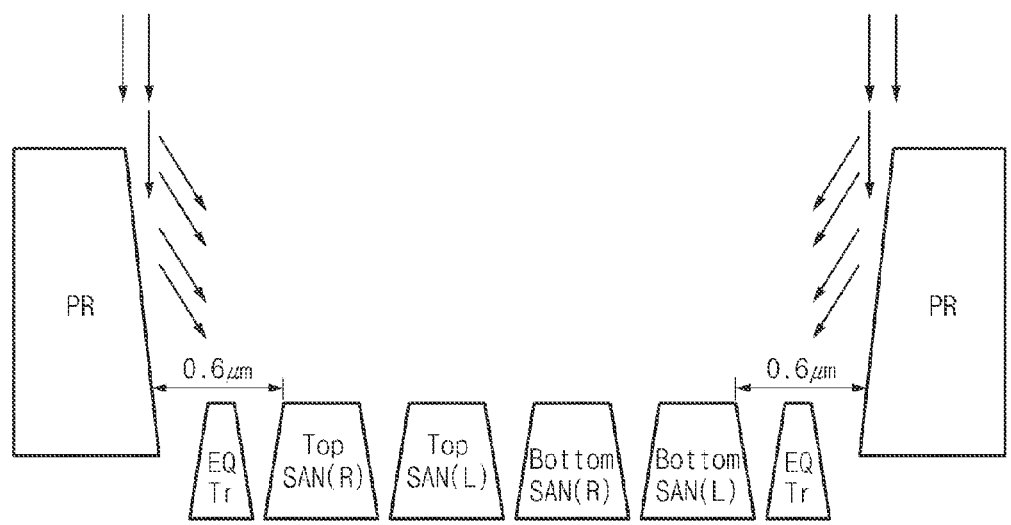
FIG. 4 is a view illustrating a relationship between a photoresist (PR) covering a PMOS transistor region and NMOS transistors in the sense amplifier having the layout of FIG. 3.

FIG. 4 is a view illustrating a relationship between a photoresist PR covering a PMOS transistor region and NMOS transistors in the sense amplifier having the layout of FIG. 3.

As shown in FIG. 4, since the equalization transistors EQ Tr, each configured of an NMOS transistor, are formed between the PMOS transistors (not shown in FIG. 4 since the equalization transistor is covered by the photoresist PR) and the NMOS transistors Top SAN and Bottom SAN constituting the sense amplifier, each of the equalization transistors EQ Tr is formed on an outer side of the NMOS transistors Top SAN or Bottom SAN, respectively. Therefore, the distances between the sidewall PRW of the photoresist PR and active regions of the NMOS transistors Top SAN(R) and Bottom SAN(L) in the sense amplifier are considerably larger as compared with those of prior art sense amplifiers. In an embodiment, the distances between upper surfaces of the active regions of the NMOS transistors Top SAN(R) and Bottom SAN(L) and the sidewall PRW of the photoresist PR may be 0.6 μm or more.

In an embodiment, the distances between the pair of NMOS transistors Top SAN(R) and Top SAN(L) and the sidewall PRW of the photoresist PR and the distances between the NMOS transistors Bottom SAN(R) and Bottom SAN(L) and the sidewall PRW of the photoresist PR may still be different from each other. However, some or all the NMOS transistors may be disposed to be significantly spaced apart from the sidewall PRW of the photoresist PR, for example, 0.6 μm or more. Thus, an effect on the NMOS transistors Latch Tr-NMOS caused by the impurities collided with and reflected from the sidewall PRW of the photoresist PR in the impurity implantation process may be minimized. Consequently, occurrence of mismatch between the NMOS transistors that form a pair can be minimized.

Since the amount of impurities reflected and scattered by the sidewall PRW of the photoresist PR at a location 0.6 μm or more from the sidewall PRW tends to be very small, although the distances between the NMOS transistors Top SAN(R) and Top SAN(L) and the sidewall PRW and the distances between Bottom SAN(R) and Bottom SAN(L) and the sidewall PRW are different from each other, any mismatch that occurs will be insignificant and hence negligible.

In an embodiment, each of the equalization transistors EQ Tr operates individually without operating in pair and thus mismatch generally does not occur.

For example, in the above-described embodiment, the equalization transistor EQ Tr is used as a transistor in a buffer to prevent the mismatch due to impurities. However, any transistor of the transistors constituting the sense amplifier that does not operate in pair to cause mismatch may be used as the buffer for mismatch prevention.

In addition, a dummy transistor may be formed as the buffer for mismatch prevention in the sense amplifier. In this case, however, an area occupied by the sense amplifier may be increased.

Furthermore, although in the above-described embodiment the NMOS transistors are illustrated to be formed on an inner side of the PMOS transistors, in other embodiments the positions of the NMOS transistors and the PMOS transistors may be exchanged. For example, the pair of PMOS transistors Top SAN(R) and Top SAN(L) may be formed on an inner side of the equalization transistor EQ Tr, with the pair of NMOS transistors Top SAN(R) and Top SAN(L) formed on an outer side of the equalization transistor EQ Tr that is closer to the sidewall PRW of the photoresist PR. Similarly, the pair of PMOS transistors Bottom SAN(R) and Bottom SAN(L) may be formed on an inner side of the equalization transistor EQ Tr, with the pair of NMOS transistors Bottom SAN(R) and Bottom SAN(L) formed on an outer side of the equalization transistor EQ Tr that is closer to the sidewall PRW of the photoresist PR.

According to an embodiment of the incentive concept, a transistor which is not affected on the mismatch is formed between the PMOS transistor and the NMOS transistor as the buffer for mismatch prevention so that the mismatch between the transistors which operate in pair can be minimized.

The above embodiment of the present disclosure is illustrative and not limitative. Various alternatives and equivalents are possible. The present disclosure is not limited by the embodiment described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor memory device, comprising:
    a sense amplifier configured to sense and amplify a difference between signals of a bit line pair, the sense amplifier including PMOS transistors and NMOS transistors; and
    a buffer, configured to prevent mismatch of threshold voltages of the PMOS transistors and the NMOS transistors, disposed in a region between a region of the PMOS transistors and a region of the NMOS transistors of the sense amplifier.

2. The semiconductor memory device of claim 1, wherein the buffer includes an equalization transistor configured to cause voltage levels of the bit line pair to be equalized according to a precharge signal.

3. The semiconductor memory device of claim 1, wherein the buffer includes a dummy transistor.

4. The semiconductor memory device of claim 1, wherein the NMOS transistors are formed on an inner side of the buffer, and the PMOS transistors are formed on an outer side of the buffer that is closer to a sidewall of a photoresist covering the region of the PMOS transistors than the inner side.

5. The semiconductor memory device of claim 4, wherein at least one of the NMOS transistors of the sense amplifier is spaced from the sidewall of the photoresist by 0.6 µm or more.

6. The semiconductor memory device of claim 1, wherein the PMOS transistors are formed on an inner side of the buffer, and the NMOS transistors are formed on an outer side of the buffer that is closer to a sidewall of a photoresist covering the region of the NMOS transistors than the inner side.

7. The semiconductor memory device of claim 6, wherein at least one of the PMOS transistors of the sense amplifier is spaced from the sidewall of the photoresist by 0.6 µm or more.

8. The semiconductor memory device of claim 1, wherein the buffer includes an equalization transistor, and wherein the NMOS transistors of the sense amplifier are formed on an inner side of the equalization transistor and the PMOS transistors of the sense amplifier are formed on an outer side of the equalization transistor that is closer to a sidewall of a photoresist covering the region of the NMOS transistors than the inner side.

9. The semiconductor memory device of claim 8, wherein at least one of the NMOS transistors of the sense amplifier is spaced from the sidewall of the photoresist by 0.6 µm or more.

10. The semiconductor memory device of claim 1, wherein the buffer includes an equalization transistor, and wherein the PMOS transistors of the sense amplifier are formed on an inner side of the equalization transistor and the NMOS transistors of the sense amplifier are formed on an outer side of the equalization transistor that is closer to a sidewall of a photoresist covering the region of the PMOS transistors than the inner side.

11. The semiconductor memory device of claim 10, wherein at least one of the PMOS transistors of the sense amplifier is spaced from the sidewall of the photoresist by 0.6 µm or more.

12. The semiconductor memory device of claim 1, wherein the sense amplifier is a cross-coupled latch type sense amplifier.

13. A semiconductor memory device, comprising:
    a sense amplifier configured to sense and amplify a difference between signals of a bit line pair, the sense amplifier including first type MOS transistors and second type MOS transistors; and
    a buffer disposed in a region between a region of the first type MOS transistors and a region of the second type MOS transistors of the sense amplifier,
    wherein the first type MOS transistors are formed on an inner side of the buffer, and the second type MOS transistors are formed on an outer side of the buffer that is closer to a sidewall of a photoresist covering the region of the second type MOS transistors than the inner side.

14. The semiconductor memory device of claim 13, wherein the first type MOS transistors are NMOS transistors and the second type MOS transistors are PMOS transistors.

15. The semiconductor memory device of claim 13, wherein the first type MOS transistors are PMOS transistors and the second type MOS transistors are NMOS transistors.

16. The semiconductor memory device of claim 13, wherein at least one of the first type MOS transistors of the sense amplifier is spaced from the sidewall of the photoresist by 0.6 µm or more.

17. The semiconductor memory device of claim 13, wherein the buffer includes an equalization transistor configured to cause voltage levels of the bit line pair to be equalized according to a precharge signal.

18. The semiconductor memory device of claim 13, wherein the buffer includes a dummy transistor.

* * * * *